United States Patent
Pourjabar et al.

(10) Patent No.: US 11,362,683 B2
(45) Date of Patent: Jun. 14, 2022

(54) VARIABLE RATE LOW DENSITY PARITY CHECK DECODER

(71) Applicant: THE TEXAS A&M UNIVERSITY SYSTEM, College Station, TX (US)

(72) Inventors: Sina Pourjabar, College Station, TX (US); Gwan Seong Choi, College Station, TX (US)

(73) Assignee: The Texas A&M University System, College Station, TX (US)

(*) Notice: Subject to any disclaimer, the term of this patent is extended or adjusted under 35 U.S.C. 154(b) by 0 days.

(21) Appl. No.: 17/239,370

(22) Filed: Apr. 23, 2021

(65) Prior Publication Data

US 2021/0336636 A1 Oct. 28, 2021

Related U.S. Application Data

(60) Provisional application No. 63/015,160, filed on Apr. 24, 2020.

(51) Int. Cl.
| | | |
|---|---|---|
| H03M 13/35 | (2006.01) | |
| H03M 13/37 | (2006.01) | |
| H03M 13/11 | (2006.01) | |
| H03M 13/43 | (2006.01) | |
| H03M 13/29 | (2006.01) | |

(52) U.S. Cl.
CPC ..... *H03M 13/353* (2013.01); *H03M 13/1185* (2013.01); *H03M 13/2948* (2013.01); *H03M 13/3707* (2013.01); *H03M 13/43* (2013.01)

(58) Field of Classification Search
CPC .............. H03M 13/353; H03M 13/3707
See application file for complete search history.

(56) References Cited

U.S. PATENT DOCUMENTS

| | | | |
|---|---|---|---|
| 9,537,508 B1* | 1/2017 | Nguyen | H03M 13/118 |
| 2004/0098659 A1* | 5/2004 | Bjerke | H03M 13/6393 |
| | | | 714/776 |
| 2010/0325511 A1* | 12/2010 | Oh | H03M 13/6356 |
| | | | 714/752 |
| 2012/0036410 A1* | 2/2012 | Rault | H03M 13/6552 |
| | | | 714/752 |
| 2014/0101512 A1* | 4/2014 | Djordjevic | H03M 13/1148 |
| | | | 714/758 |
| 2015/0349803 A1* | 12/2015 | Murakami | G06F 11/10 |
| | | | 714/752 |
| 2019/0181884 A1* | 6/2019 | Sun | H03M 13/1185 |

OTHER PUBLICATIONS

Gallager, R., Low-Density Parity-Check Codes. IRE Transactions on Information Theory, 1962. 8(1): p. 21-29.

MacKay, D.J. et al.: Near Shannon Limit Performance of Low Density Parity Check Codes. Electronic letters, 1996. 32(18): p. 1645-1646.

(Continued)

*Primary Examiner* — Joseph D Torres
(74) *Attorney, Agent, or Firm* — Conley Rose, P.C.

(57) ABSTRACT

A method includes receiving a first data frame and a second data frame from a communication channel; decoding the first data frame using a first portion of an extended parity-check matrix (PCM); and decoding the second data frame using a second portion of the extended PCM. The first portion is a subset of the second portion.

13 Claims, 9 Drawing Sheets

(56) References Cited

OTHER PUBLICATIONS

Maiya, S.V. et al.: Low latency Coding: Convolutional Codes vs. LDPC Codes. IEEE Transactions on Communications, 2012. 60(5): p. 1215-1225.

Battaglioni, M. et al.: Compact QC-LDPC Block and SC-LDPC Convolutional Codes for Low-Latency Communications, 2018 IEEE 29th Annual International Symposium on Personal, Indoor and Mobile Radio Communications (PIMRC). 2018. IEEE.

Sham, C.-W. et al.: A 2.0 Gb/s Throughput Decoder for QC-LDPC Convolutional Codes. IEEE Transactions on Circuits and Systems I: Regular Papers, 2013. 60(7): p. 1857-1869.

Cain, J. et al.: Punctured Convolutional Codes of Rate (n-1)/n and Simplified Maximum Likelihood Decoding (Corresp.). IEEE Transactions on Information Theory, 1979. 25(1): p. 97-100.

Hagenauer, J.: Rate-Compatible Punctured Convolutional Codes (RCPC Codes) and their Applications. IEEE Transactions on Communications, 1988. 36(4): p. 389-400.

Yasuda, Y. et al.: High-Rate Punctured Convolutional Codes for Soft Decision Viterbi Decoding. IEEE Transactions on Communications, 1984. 32(3): p. 315-319.

Li, J. et al.: Rate-Compatible Low Density Parity Check Codes for Capacity-Approaching ARQ Schemes in Packet Data Communications. Communications, Internet and Information Technology, 2002.

Nguyen, T. et al.: The Design of Rate-Compatible Protograph LDPC Codes. IEEE Transactions on Communications, 2012. 60(10): p.

Lin, S. et al.: A Hybrid ARQ Scheme with Parity Retransmission for Error Control of Satellite Channels. IEEE Transactions on Communications, 1982. 30(7): p. 1701-1719.

Liu, J. et al.: Rate-Compatible LDPC Codes with Short Block Lengths Based on Puncturing and Extension Techniques. AEU-International Journal of Electronics and Communications, 2015. 69(11): p. 1582-1589.

3GPP TSG RAN WG1 NR AH #2, Qingdao, China, Jun. 27-30, 2017, Agenda Item 5.1.4.1.2.; WF on LDPC Parity Check Matrices, Document R1-1711982, 2017.

Yoshikane, N.: Possible Network Parameters on IMT-2020/5G Transport Network, 2017.

Hu, X. et al.: Efficient Implementations of the Sum-Product Algorithm for Decoding LDPC Codes. GLOBECOM'01. IEEE Global Telecommunications Conference (Cat. No 01CH37270). 2001. IEEE.

Chen, J. et al.: Density Evolution for Two Improved BP-based Decoding Algorithms of LDPC Codes. IEEE Communications Letters, 2002. 6(5): p. 208-210.

Blanksby, A.J. et al.: A 690-mW 1-Gb/s 1024-b, Rate-1/2 Low-Density Parity-Check Code Decoder. IEEE Journal of Solid-State Circuits, 2002. 37(3): p. 404-412.

Yeo, E. et al.: Architectures and Implementations of Low-Density Parity Check Decoding Algorithms. The 2002 45th Midwest Symposium on Circuits and Systems, 2002. MSWCAS-2002. IEEE.

Zhang, T. et al.: A 54 MBPS (3, 6)—Regular FPGA LDPC Decoder, IEEE Workshop on Signal Processing Systems, 2002. IEEE.

Hocevar, D.E.: A Reduced Complexity Decoder Architecture via Layered Decoding of LDPC Codes. IEEE Workshop on Signal Processing Systems, 2004. SIPS 2004. 2004. IEEE.

Chandrasetty, V.A. et al.: An Area Efficient LDPC Decoder Using a Reduced Complexity Min-Sum Algorithm. Integration, 2012. 45(2): p. 141-148.

Patel, D.J. et al.: Design and Implementation of Quasi Cyclic Low Density Parity Check (QC-LDPC) Code on FPGA. 2017 International Conference on Wireless Communications, Signal Processing and Networking (WiSPNET). 2017. IEEE.

Liu, G.: Gaussian Noise Generator IP Core Specification. Jul. 2016. Available from: https://github.com/liuguangxi/gng.

* cited by examiner

VARIABLE RATE LOW DENSITY PARITY CHECK DECODER

CROSS-REFERENCE TO RELATED APPLICATIONS

This application claims benefit of U.S. provisional patent application Ser. No. 63/015,160 filed Apr. 24, 2020, and entitled "CVR: A Continuously Variable Rate LDPC Decoder Using Parity Check," which is hereby incorporated herein by reference in its entirety.

STATEMENT REGARDING FEDERALLY SPONSORED RESEARCH OR DEVELOPMENT

Not applicable.

BACKGROUND

Data communication systems use iterative error correction codes (ECCs) that operate in accordance with forward error correction (FEC). In communication systems that use ECCs, a first communication device at one end of a wired or wireless communication channel includes encoder capability and a second communication device at the other end of the communication channel includes decoder capability. In some cases, one or both of these two devices include encoder and decoder capability (e.g., within a bidirectional communication system). ECCs can be applied in other systems as well, such as data storage systems (e.g., hard disk drive (HDD) and other memory storage devices), in which data is encoded before writing to the storage media, and then the data is decoded after being read/retrieved from the storage media.

One type of ECC is a low-density parity check (LDPC) code. LDPC codes are iterative, block codes that enable parallel decoding architecture, which improves throughput of the communication system. One disadvantage to block codes such as LDPC codes is that the decoder stalls until a whole frame is received before starting to decode the frame. This stall time results in communication system latency. The latency has a particular impact on communications system performance with respect to decoding the first frame of a data stream, because there is no previous frame that the pipelined decoder structure can decode.

SUMMARY OF THE DISCLOSURE

In accordance with one example of this description, a method includes receiving a first data frame and a second data frame from a communication channel; decoding the first data frame using a first portion of an extended parity-check matrix (PCM); and decoding the second data frame using a second portion of the extended PCM. The first portion is a subset of the second portion.

In accordance with another example of this description, a device includes a receiver configured to receive a first data frame and a second data frame from a communication channel, and a decoder coupled to the receiver. The decoder is configured to decode the first data frame using a first portion of an extended parity-check matrix (PCM), and decode the second data frame using a second portion of the extended PCM. The first portion is a subset of the second portion.

In accordance with yet another example of this description, a non-transitory, computer-readable medium contains instructions that, when executed by a processor of a device, cause the device to be configured to receive a first data frame and a second data frame from a communication channel; decode the first data frame using a first portion of an extended parity-check matrix (PCM); and decode the second data frame using a second portion of the extended PCM. The first portion is a subset of the second portion.

Embodiments described herein comprise a combination of features and characteristics intended to address various shortcomings associated with certain prior devices, systems, and methods. The foregoing has outlined rather broadly the features and technical characteristics of the disclosed embodiments in order that the detailed description that follows may be better understood. The various characteristics and features described above, as well as others, will be readily apparent to those skilled in the art upon reading the following detailed description, and by referring to the accompanying drawings. It should be appreciated that the conception and the specific embodiments disclosed may be readily utilized as a basis for modifying or designing other structures for carrying out the same purposes as the disclosed embodiments. It should also be realized that such equivalent constructions do not depart from the spirit and scope of the principles disclosed herein.

BRIEF DESCRIPTION OF THE DRAWINGS

For a detailed description of various exemplary embodiments, reference will now be made to the accompanying drawings in which.

DETAILED DESCRIPTION

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection of the two devices, or through an indirect connection that is established via other devices, components, nodes, and connections.

Examples of this disclosure are directed to a decoder and a method for decoding data to address the foregoing problems. In particular, the decoder and methods described herein use a base parity-check matrix (PCM), such as a mother code including an information part and a parity part. An extended PCM is created using the base PCM and the base PCM is a subset of the extended PCM. Information bits are received over a communication channel (e.g., a wireless communication channel, a wired communication channel, a data transfer channel from a data storage system) and, in accordance with examples of this disclosure, dynamically decoded using at least a first portion of the extended PCM or a second portion of the extended PCM. The first portion is a subset of the second portion. In one example, the first portion of the extended PCM is the base PCM and the second portion of the extended PCM is all of the extended PCM. However, as described further below, in other examples the first and second portions are other subsets of the extended PCM, including at least the base PCM.

Regardless of the particular format of the first and second portions of the extended PCM, whether to use the first portion or the second portion to decode received data is determined based on various factors. For example, a first frame of a data stream may be decoded using the first portion, while subsequent frames of the data stream are decoded using the second portion. Because the first portion is a subset of the second portion, fewer data bits are needed to begin decoding using the first portion of the extended PCM. Accordingly, the first frame of the data stream is able to be decoded more quickly (e.g., in less time) after the first bit of the first frame is received than if the first frame was decoded using the second portion of the extended PCM. Because decoding the subsequent frames in the data stream occurs in parallel with decoding the first frame, latency of the communication system is reduced by decoding the frame more quickly using the first portion of the extended PCM.

In another example, a quality of the communication channel (e.g., signal-to-noise ratio (SNR) measured in decibels (dB)) influences whether to use the first portion or the second portion of the extended PCM to decode a data frame. As described further below, decoding performance is improved by using the second portion of the extended PCM, and thus it may be advantageous to decode using the second portion of the extended PCM, rather than the first portion, responsive to the quality of the communication channel being relatively lower. For example, if the SNR is greater than a first threshold, a received data frame is decoded using the first portion of the extended PCM. However, if the SNR is less than a second threshold, the received data frame is decoded using the second portion of the extended PCM. In some examples, the first and second thresholds are the same value and thus the determination is a binary decision; however, in other examples the first and second thresholds are different values (e.g., the second threshold represents a lower quality of the communication channel than the first threshold).

In yet another example, an average number of decoding iterations influences whether to use the first portion or the second portion of the extended PCM to decode a data frame. As described further below, decoding data frames using LDPC codes may take varying numbers of iterations (e.g., to decode and/or correct errors in a data frame). Accordingly, the average number of decoding iterations required over a number of data frames is a relative indicator of communication channel performance, and thus it may be advantageous to decode using the second portion of the extended PCM, rather than the first portion, responsive to the average number of decoding iterations being relatively higher. For example, if the average number of iterations is less than a first threshold, a received data frame is decoded using the first portion of the extended PCM. However, if the average number of iterations is greater than a second threshold, the received data frame is decoded using the second portion of the extended PCM. In some examples, the first and second thresholds are the same value and thus the determination is a binary decision; however, in other examples the first and second thresholds are different values (e.g., the second threshold represents a greater average number of iterations, or a lower performance of the communication channel than the first threshold).

In examples of this description, information bits are dynamically decoded using at least a first portion of the extended PCM or a second portion of the extended PCM. Decoding using the first portion of the extended PCM reduces latency and/or improves throughput of the communication system, while decoding using the second portion of the extended PCM improves error correcting performance, such as by reducing the bit error rate (BER) and/or frame error rate (FER) of received data frames in a data stream. These and other examples are described more fully below, with reference made to the accompanying figures.

Figure 1:
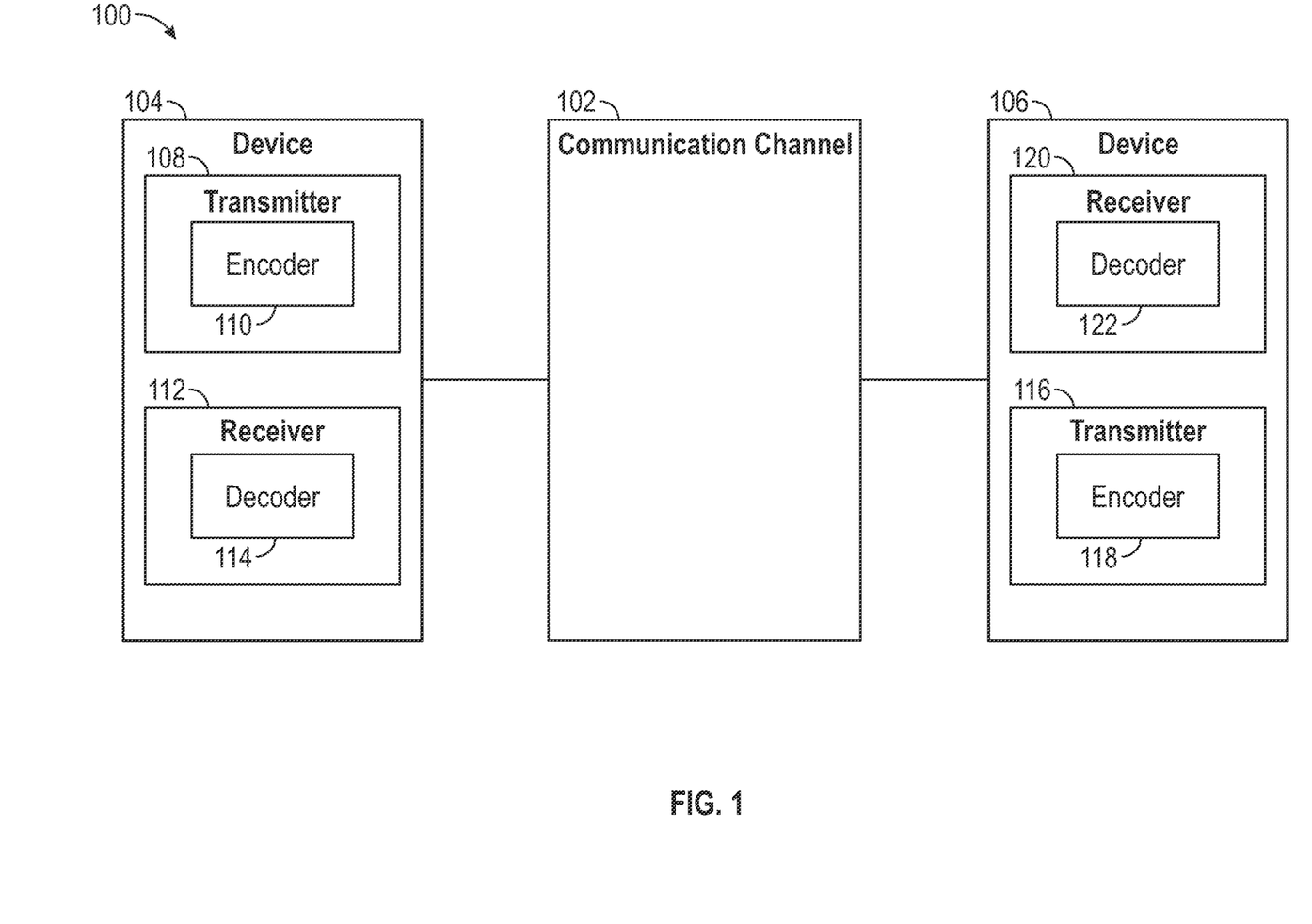
FIG. 1 is a block diagram of a communications system in accordance with examples of this description.

As described above, examples of this description generally relate to communication systems. In such systems, digital data is transmitted from one location (e.g., a first device) to another location (e.g., a second device). It is advantageous that such data be transmitted without errors, or with an acceptably low error rate. FIG. 1 is a block diagram of a communications system 100 in accordance with examples of this description. The communications system 100 may use various types of communication channels, such as wireless communications channels, wired communication channels, fiber optic communication channels, and the like.

The communications system 100 includes a communication channel 102 that couples a first device 104 at one end of the communication channel 102 to a second device 106 at the other end of the communication channel 102. The first device 104 includes a transmitter 108 having an encoder 110, and a receiver 112 having a decoder 114. Similarly, the second device 106 includes a transmitter 116 having an encoder 118, and a receiver 120 having a decoder 122. In other examples, either of the devices 104, 106 may include only a transmitter or a receiver.

As described above, the communication channel 102 may be implemented in various ways. In one example, the communication channel 102 is a wireless communication channel (e.g., using satellite- or antenna-based communication). In another example, the communication channel 102 is a wired communication channel (e.g., using fiber optic or metal interconnects). Further, in yet another example, one of the devices 104 comprises a memory storage device, and the other device 106 encodes data using encoder 118 before writing to the memory storage device 104. Subsequently, data is decoded by the decoder 122 after being read by the device 106 from the memory storage device 104.

In one example, information bits are provided to the encoder 110 of the device 104, which encodes the information bits according to an encoding scheme (e.g., using an LDPC code). The encoder 110 provides the encoded information bits to the transmitter 108 of the device 104, which facilitates transmission of a data frame including the encoded information bits to the device 106 using the communication channel 102. The data frame is received by the receiver 120 of the device 106 from the communication channel 102. The receiver 120 provides the data frame to the decoder 122 of the device 106, which decodes the data frame (e.g., using an LDPC code) to retrieve the encoded information bits without errors, or with an acceptably low error rate. Communication in the other direction, such as from the device 106 to the device 104, occurs in a like manner as described above. Examples of this description are generally directed to the structure of the decoders 114, 122 and/or the functionality associated therewith.

Figure 2A:
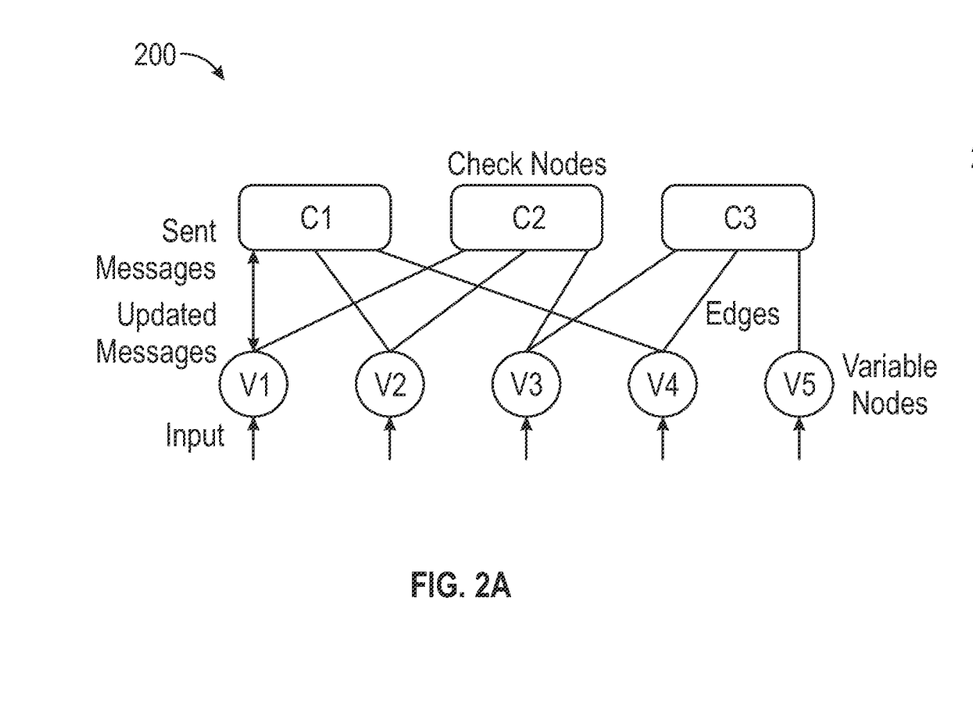
FIG. 2a is a bipartite graph of a low-density parity check (LDPC) code in accordance with examples of this description.
Figure 2B:
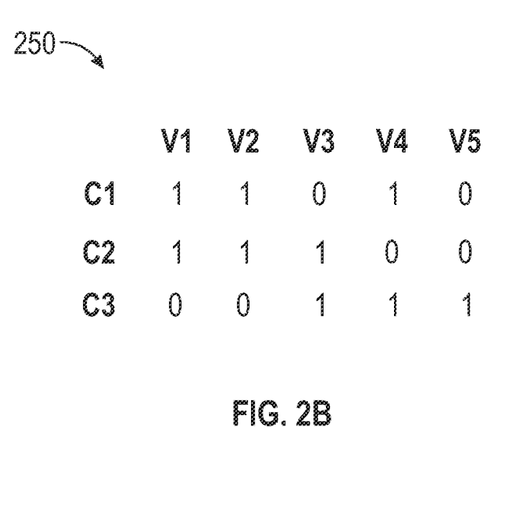
FIG. 2b is a parity-check matrix (PCM) corresponding to the bipartite graph of FIG. 2a in accordance with examples of this description.

An LDPC code is specified by a parity-check matrix (PCM) H that is mapped to a bipartite graph. FIG. 2a illustrates an example of an LDPC code bipartite graph 200, which may also be referred to as a Tanner graph. The graph 200 includes check nodes C1, C2, C3 and variable nodes V1, V2, V3, V4, V5. The lines connecting check nodes to variable nodes are referred to as "edges" of the graph 200. FIG. 2b illustrates an example of the PCM H 250 that corresponds to the bipartite graph 200 shown in FIG. 2a. The bipartite graph 200 is defined by N variable nodes (e.g., N=5 in the example of FIG. 2a) and M check nodes (e.g., M=3 in the example of FIG. 2a). Accordingly, the PCM H 250 has N columns and M rows. A value of '1' in a location in the PCM H 250 indicates an edge between the check node corresponding to the row of the location and the variable node corresponding to the column of the location.

In LDPC codes, variable nodes provide the channel data for the check nodes while the check nodes perform error detection and error correction by updating the messages.

The LDPC code having a particular bipartite graph can be used to decode a number of bits (e.g., of a data frame) equal to the number of variable nodes in the bipartite graph, or the number of columns in a corresponding PCM. Additionally, decoding using the LDCP code cannot begin until that number of bits has been received because of the block code nature of LDCP codes. Thus, in the specific example of FIGS. 2a and 2b, the LDPC code having the bipartite graph 200 and corresponding PCM 250 is used to decode 5 bits, and cannot begin decoding until all 5 bits have been received. In some examples, the inputs to the variable nodes are log-likelihood ratios (LLR) or probabilities. For example, in binary phase shift keying (BPSK) modulation, a positive LLR value is represented by a binary value of 0 and a negative LLR value is represented by a binary value of 1.

Figure 3:
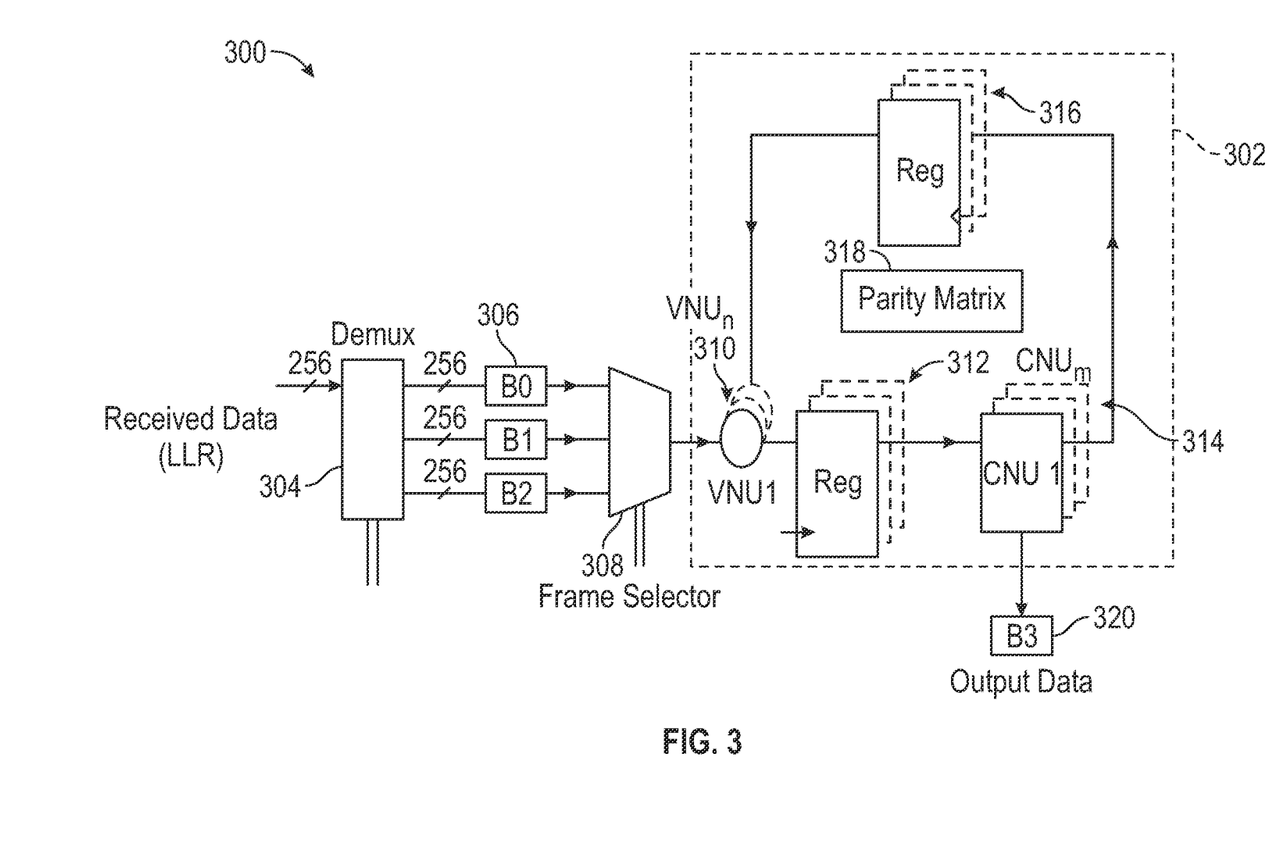
FIG. 3 is a block diagram including a decoder in accordance with examples of this description.

FIG. 3 is a block diagram of a system 300 in accordance with examples of this disclosure. The system 300 includes a decoder 302 configured to implement a LDPC code decoding scheme. The system 300 can be implemented on either of the devices 104, 106, for example as part of the receivers 112, 120. Accordingly, the decoder 302 may be similar in structure and function to implement the decoders 114, 122, described above.

The system 300 includes a demultiplexer 304 that receives input data, such as LLRs and/or bits of a data frame. As described above, input data is received from the communication channel 102. In an example, the demultiplexer 304 implements a time-based demultiplexing scheme that directs the input data to one of multiple outputs responsive to a time at which the input data is received from the communication channel 102. For example, the demultiplexer 304 directs a first received data frame to a first (e.g., uppermost) of its outputs, a second received data frame to a second (e.g., middle) of its outputs, and a third received data frame to a third (e.g., lowermost) of its outputs. In the example of FIG. 3, the demultiplexer 304 has three outputs, but in other examples the demultiplexer 304 has more or fewer outputs.

The system 300 also includes buffers 306 configured to receive and store data from each of the demultiplexer 304 outputs. For example, buffer B0 receives and stores data from the first demultiplexer 304 output (e.g., the first data frame), buffer B1 receives and stores data from the second demultiplexer 304 output (e.g., the second data frame), and buffer B2 receives and stores data from the third demultiplexer 304 output (e.g., the third data frame). As above, the example of FIG. 3 includes three buffers 306, but in other examples in which the demultiplexer 304 has more or fewer outputs, more or fewer buffers 306 are provided accordingly.

The system 300 also includes a multiplexer 308 configured to receive the data frames from each of the buffers 306 and provide the data frame from one of the buffers 306 as an output of the multiplexer 308. The buffer 306 to be provided as the output of the multiplexer 308 is selected responsive to a frame select signal. The data frame output of the multiplexer 308 is provided to the decoder 302, which decodes the data frame as explained further below.

In particular, the decoder 302 implements LDPC decoding and thus includes variable nodes 310 corresponding to the LDPC code bipartite graph or PCM. In the example of FIG. 3, the LDPC code is specified by the PCM 318. The number of variable nodes 310 is based on the structure of the LDPC code being implemented by the decoder 302 (e.g., specified by the PCM 318). In this example, the variable nodes 310 are also indicated as variable node units VNU1 through VNUn. The variable nodes 310 receive the output of the multiplexer 308, which may be a portion or all of a data frame. The variable nodes 310 function to add updated messages received from other check nodes. A first bank of registers 312 receives the output of the variable nodes 310 (e.g., the first bank of registers 312 includes a number of registers corresponding to the number of variable nodes 310).

The decoder 302 also includes check nodes 314 corresponding to the LDPC code bipartite graph or PCM. The number of check nodes 314 is based on the structure of the LDPC code being implemented by the decoder 302 (e.g., specified by the PCM 318). In this example, the check nodes 314 are also indicated as check node units CNU1 through CNUm. The check nodes 314 receive the data held by the first bank of registers 312. The check nodes 314 function to update messages received from the variable nodes 310. A second bank of registers 316 receives the output of the check nodes 314 (e.g., the second bank of registers 312 includes a number of registers corresponding to the number of check nodes 314. Additionally, once any errors present in the data frame received from the multiplexer 308 have been corrected, the check nodes 314 provide corrected output data to an output buffer 320. Alternately, if a maximum number of decoder 302 iterations is reached and errors still remain in the data frame being decoded, the check nodes 314 provide the resulting data frame (including remaining errors) to the output buffer 320.

In accordance with examples of this description, the PCM 318 is an extended PCM 318. The extended PCM 318 includes a base PCM, such as a mother code including an information part, and a parity part. Thus, the base PCM is a subset of the extended PCM 318. The decoder 302 is configured to dynamically decode data frames received from the multiplexer 308 using at least a first portion of the extended PCM 318 or a second portion of the extended PCM 318. The first portion is a subset of the second portion. In one example, the first portion of the extended PCM 318 is the base PCM and the second portion of the extended PCM is all of the extended PCM 318. However, as described further below, in other examples the first and second portions are other subsets of the extended PCM 318, including at least the base PCM.

When the decoder 302 decodes one or more data frames (e.g., of a data stream) received from the multiplexer 308 using a subset of the extended PCM 318 (e.g., the first portion described above), only a subset of the variable nodes 310 and a subset of the check nodes 314 (e.g., corresponding to the subset of the extended PCM 318) are required for decoding. Accordingly, the decoder 302 is able to begin decoding before a full number of bits (e.g., corresponding to all of the variable nodes 310) are available. Because decoding subsequent frames in the data stream occurs in parallel with decoding the first frame, latency of the decoder 302, the system 300, and, by extension, the communication system 100 is reduced by decoding the frame more quickly using the subset of the extended PCM 318. Additionally, the decoder 302 is configured to disable the check nodes 314 that are not part of the subset of the extended PCM 318, which reduces power consumption of the decoder 302 when decoding using the subset of the extended PCM 318.

Figure 4:
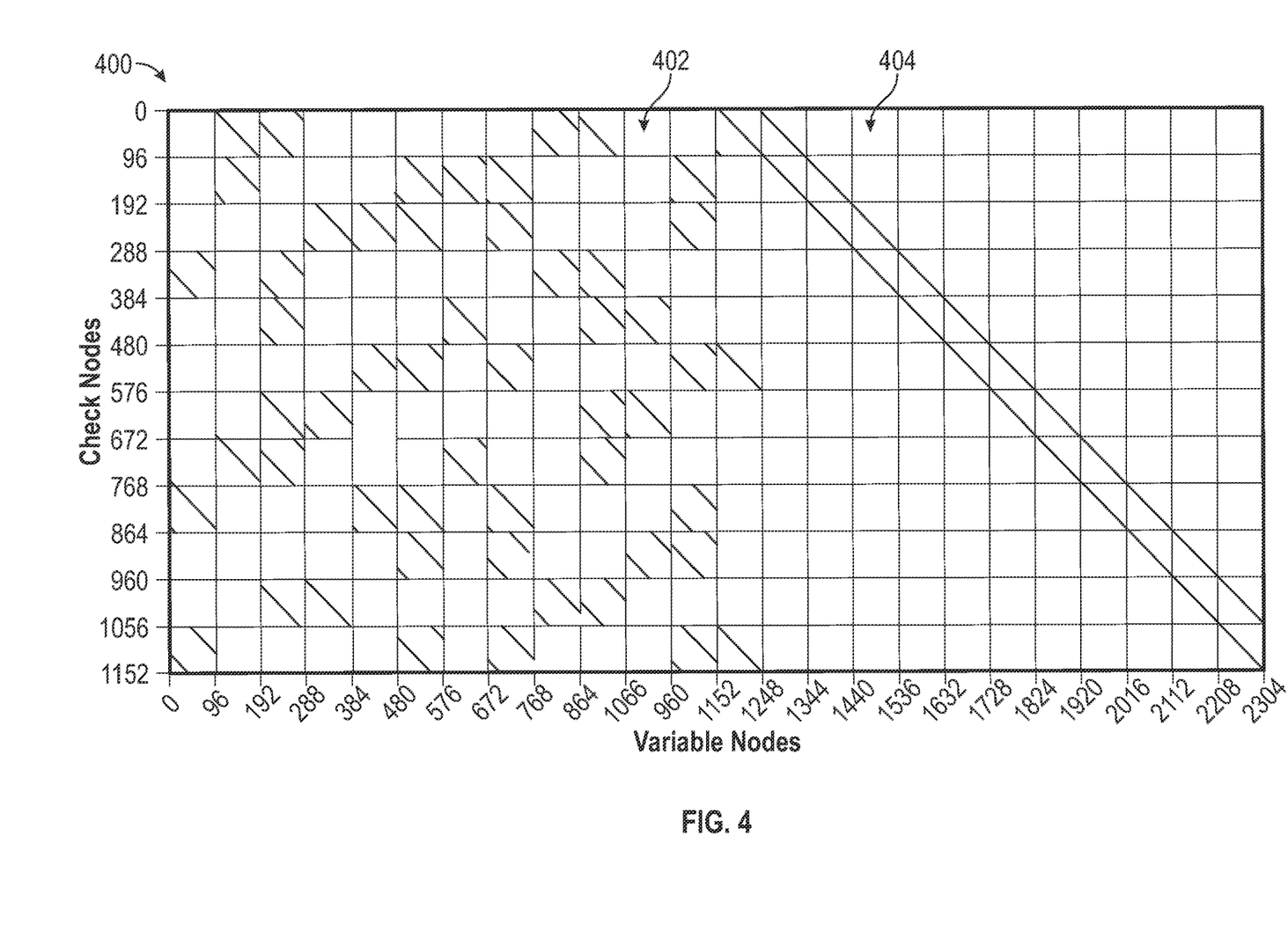
FIG. 4 is a graphical representation of a Worldwide Interoperability for Microwave Access (WiMAX) PCM mother code including an information part and a parity part in accordance with examples of this description.

FIG. 4 is a graphical representation of a Worldwide Interoperability for Microwave Access (WiMAX) PCM 400 mother code including an information part 402 and a parity part 404 in accordance with examples of this description. The WiMAX PCM 400 is one example of the base PCM described above, which is a subset of the extended PCM 318. In this example, the WiMAX PCM 400 serves as the base from which the extended PCM 318 is generated. The particular generation of the extended PCM 318 is described further below. The WiMAX PCM 400 or mother code is one example of a base PCM; however, in other examples of this disclosure, different PCMs serve as the base PCM from which the extended PCM 318 is generated. In one such example, the base PCM is a 5G PCM, which includes the mother code. In yet another example, the base PCM is a Wi-Fi PCM. Examples of this description are not necessarily limited to a particular base PCM structure unless otherwise stated.

In the example of FIG. 4, the WiMAX PCM 400 is generated with a lifting or extension value (Z) of 96, which results in 2,304 variable nodes and 1,152 check nodes. Edges or connections between the variable nodes and check nodes in the WiMAX PCM 400 are represented by black lines. In this example, a received frame size also is 2,304 bits (or LLRs), and decoding using the WiMAX PCM 400 cannot begin until the whole frame size of data is ready and available to be decoded. In the example of WiMAX, different code rates (e.g., 5/6, 3/4, 2/3, 1/2) are implemented using different information code part 402, although the width of these PCMs for a given lifting value, such as 96 in the example of FIG. 4, are the same. For example, relative widths of the information parts 402 and the parity parts 404 vary for different code rates, but the overall PCM width remains the same for a given lifting value, and thus all 2,304 bits of received data need to be available before decoding the received data. Additionally, in the example of WiMAX, because each code rate has a different corresponding PCM to be utilized, the decoder 302 and/or receiver need to store each of the different PCMs to facilitate decoding using more than one code rate.

Figure 5:
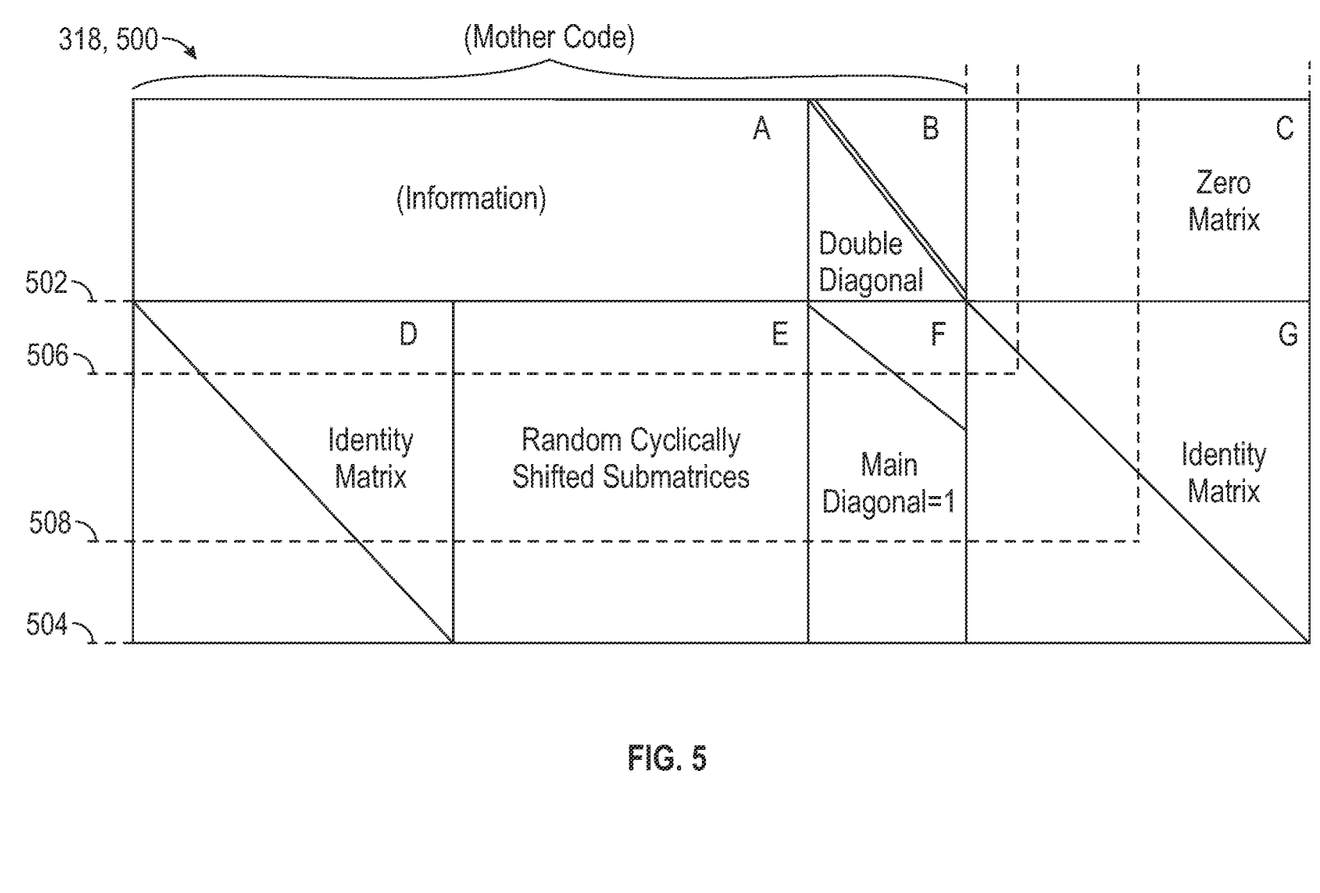
FIG. 5 is a graphical representation of an extended PCM in accordance with examples of this description.

FIG. 5 is an extended PCM 318, 500 in accordance with examples of this description. As indicated, the extended PCM 500 of FIG. 5 may be used as the extended PCM 318 in FIG. 3, described above. Higher code rates (having a relatively smaller parity part 404) provide improved throughput as well as adequate decoding and error correcting performance for relatively better communication channel 102 conditions (e.g., higher SNRs). On the other hand, lower code rates (having a relatively larger parity part 404) provide reduced throughput relative to the higher code rate, but provide improved decoding and error correcting performance for relatively worse communication channel 102 conditions (e.g., lower SNRs). Thus, increasing the number of parity bits generally improves the LDPC code performance at the expense of reducing throughput, or the number of information bits that can be decoded at a time.

Examples of this description use a relatively higher code rate base PCM from which the extended PCM 500 is generated. In FIG. 5, the base PCM (e.g., mother code) is represented by section A, which is an information part, and section B, which is a double diagonal parity part.

In an example, the base PCM is a 3/4 rate 144×576 WiMAX PCM. In this example, the base PCM is extended to a 1/2 rate 432×864 extended PCM 500. As described further below, this extension method provides a better result than a 144×576 PCM and also outperforms a non-extended standard 1/2 rate WiMAX PCM having the same size of 432×864.

As described above, section A of the extended PCM 500 is the information part (e.g., similar to the information part 402 described above) and section B of the extended PCM 500 is the dual diagonal parity part, which in the example of WiMAX, is defined in the WiMAX standard. Accordingly, sections A and B together are a standard WiMAX PCM, or mother code.

Section C of the extended PCM 500 is an all-zero matrix having a number of columns that can vary based on the number of extra parity bits. Section D of the extended PCM 500 is an identity matrix having a size equal to the number of columns in section C. Section E of the extended PCM 500 is a random, cyclically-shifted matrix having a condition in which each row consists of five to six 1's. Section F of the extended PCM 500 is located under section B and has a same number of columns as section B. Each column and row in section F has only 1 indicating an edge or connection. Section G of the extended PCM 500 is a parity part of the extended PCM 500 and, in this example, is an identity matrix.

As described above, examples of this description include using the base PCM (sections A and B, shown as portion 502) to create the extended PCM 500. Information bits (e.g., LLRs) are dynamically decoded using at least a first portion of the extended PCM 500 or a second portion of the extended PCM 500. For consistency, the first portion is a subset of the second portion. In at least one example, the first portion is the base PCM (sections A and B), while the second portion is the whole extended PCM 500, shown as portion 504. However, in other examples, the portions of the extended PCM 500 used for decoding include other subsets of the extended PCM 500 such as the portion 506 or the portion 508. In accordance with certain examples, any subset of the extended PCM 500 that includes at least the base PCM can be used for decoding received data.

In the example of FIG. 5, the portion 502 corresponds to a relatively high rate PCM e.g., 3/4 rate), while the portion 504 corresponds to a relatively lower rate PCM (e.g., 1/2 rate). Accordingly, the portions 506, 506 represent code rates between 3/4 and 1/2, and the varying performance characteristics associated with such code rates. In examples of this disclosure, because multiple code rates are available using the single extended PCM, the decoder 302 and/or receiver only needs to store the single extended PCM 318, 500 in order to facilitate decoding using more than one code rate.

In this example, decoding information bits using the first portion 502 of the extended PCM 500 reduces latency and/or improves throughput of the communication system 100, while decoding using the second portion 504 of the extended PCM 500 improves error correcting performance, such as by reducing the bit error rate (BER) and/or frame error rate (FER) of received data frames in a data stream.

The above-described approach to generating the extended PCM 500 can be applied to base PCMs different than the specific WiMAX example described. Such extensions are intended to be within the scope of this disclosure, which is not necessarily limited to a particular base PCM structure unless otherwise stated.

Figure 6:
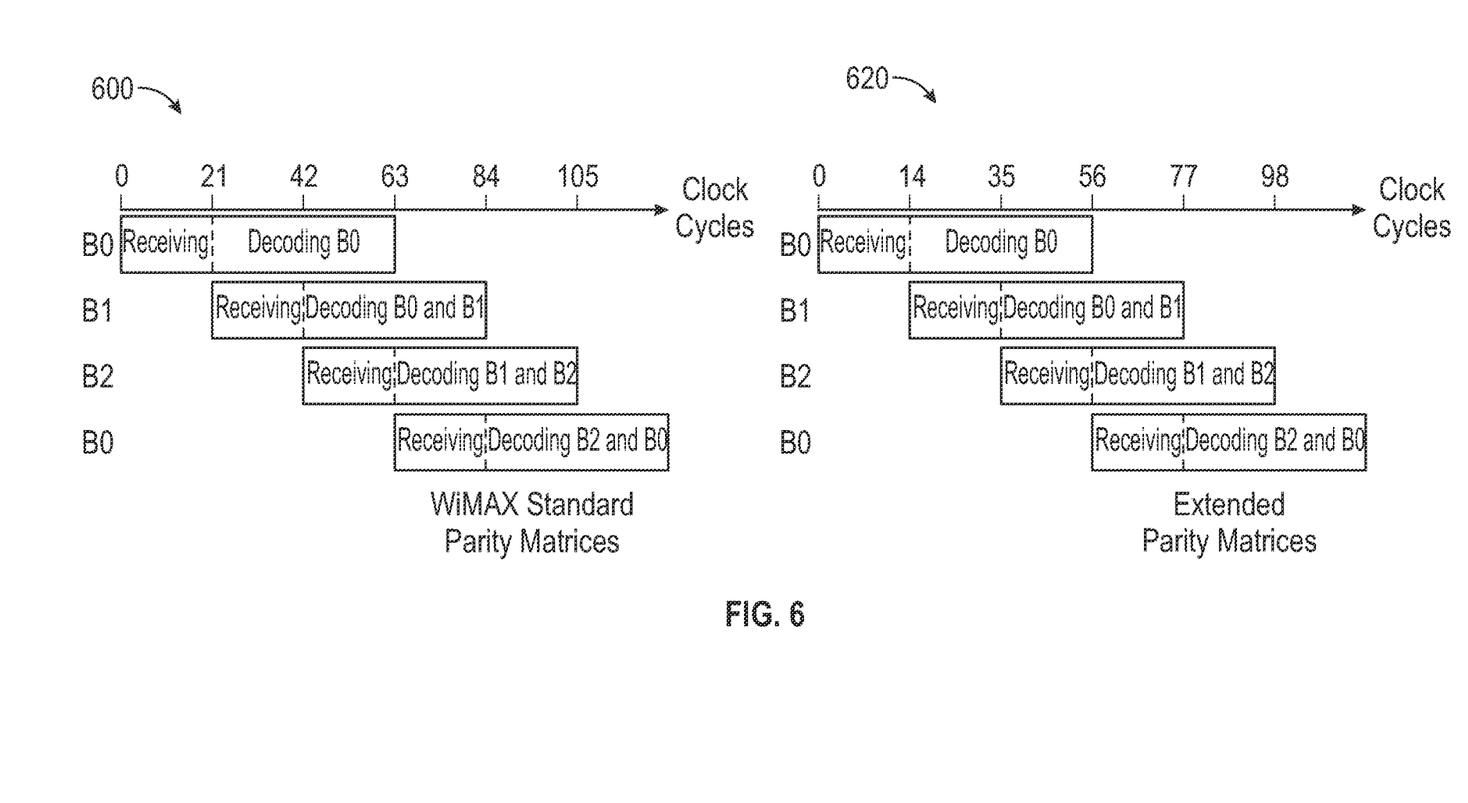
FIG. 6 is a timing diagram comparing parallel decoding times of received data frames in accordance with examples of this description.

FIG. 6 includes a timing diagram 600 that shows parallel decoding times of received data frames using a standard WiMAX PCM, as well as a timing diagram 620 that shows parallel decoding times of received data frames using the extended PCM 318, 500 described above and in accordance with examples of this description. For the purpose of providing a numerical example, it is assumed that the decoder accepts 864 LLRs, which are quantized to 6 bits.

In the timing diagram 600, an entire data frame needs to be received before decoding can begin due to the block code nature of LDPC codes as described above. Thus, in this example, receiving the first data frame into buffer B0 requires 21 clock cycles (e.g., 864 LLRs×6 bits/LLR/256-bit bus width), at which point decoding of the data frame begins.

In the timing diagram 620, however, decoding can begin earlier due to using the first portion 502 of the extended PCM 318, 500, which includes fewer variable nodes and thus requires fewer bits to begin decoding. In this particular example, receiving the first data frame into buffer B0 only requires 14 clock cycles, at which point decoding of the data frame begins. Because decoding subsequent frames in the data stream occurs in parallel with decoding the first frame, latency of the decoder 302, the system 300, and, by extension, the communication system 100 is reduced by decoding the frame more quickly using the subset of the extended PCM 318. In the timing diagram 620, it is assumed that subsequent data frames are decoded using the full extended PCM 318, 500. However, additional performance improvement may be possible in examples where at least some of the subsequent data frames are able to be decoded using a subset of the extended PCM 318, 500 that includes at least the base PCM.

Figure 7:
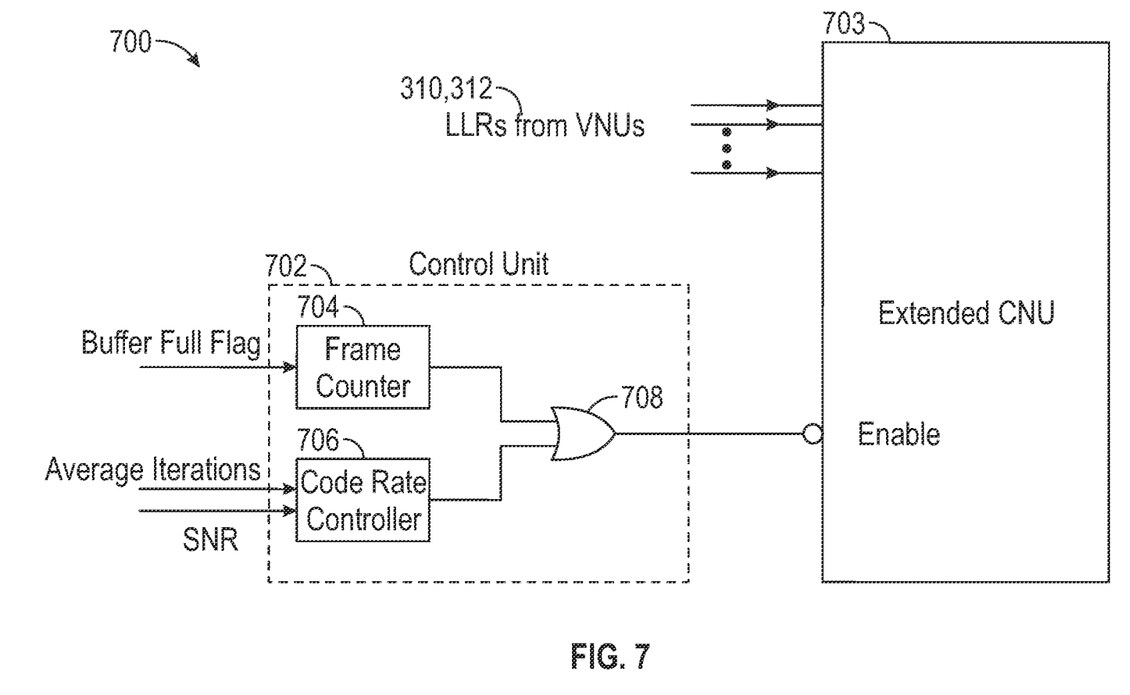
FIG. 7 is a schematic diagram of a control unit for dynamically disabling check nodes of the extended PCM shown in FIG. 5 in accordance with examples of this description.

FIG. 7 is a schematic diagram of a system 700 including a control unit 702 for dynamically disabling check nodes of the extended PCM shown in FIG. 5 in accordance with examples of this description. In some examples, the control unit 702, or portions thereof, are implemented as a field-programmable gate array (FPGA), digital signal processor (DSP), graphical processing unit (GPU), central processing unit (CPU), an application-specific integrated circuit (ASIC), or other such functionally configured hardware. As described above, certain of the check nodes 314 are not required to be used when the decoder 302 performs decoding using a subset of the extended PCM 318, 500. As shown in FIG. 5, for example, the portions 502, 506, 508 do not use at least some of the check nodes 314 (e.g., corresponding to unused rows for those portions 502, 506, 508). As described above, regardless of the particular format of the portion of the extended PCM 318, 500 used for decoding, whether to use a first, reduced portion and thus disable at least some check nodes 314 is determined based on various factors.

In the system 700, the extended CNU block 703 corresponds to the check nodes 314 that can be disabled when using less than the full extended PCM 318 to decode data. The extended CNU block 703 thus receives information bits (e.g., LLRs) from the variable nodes 310 and the first bank of registers 312, as described above. In one example, in which the first portion of the extended PCM 318 is the base PCM 502 and the second portion of the extended PCM 318 is the whole extended PCM 318, 504, the extended CNU block 703 corresponds to the check nodes 314 represented by the rows of the extended PCM 318 outside of the first portion 502. In the example of FIG. 7, it is assumed for simplicity that the extended CNUs 703 are enabled or disabled in an all-or-nothing fashion (e.g., responsive to a binary determination). However, as described above, in certain cases other portions 506, 508 of the extended PCM 318, 500 are utilized to decode a data frame, and thus only a portion of the extended CNU block 703 is enabled or disabled, accordingly.

The control unit 702 includes a frame counter 704, which is configured to receive a flag from the buffers 306 that indicates when a buffer 306 becomes full. The frame counter 704 is configured to count a number of flags received, which corresponds to a number of frames received by the buffers 306, and de-assert a frame counter 704 output responsive to the number of flags exceeding a threshold value. In the example where the first frame is decoded using the first portion of the extended PCM 318, 500 and subsequent frames are decoded using the second portion of the extended PCM 318, 500, the threshold value is 1. As a result, the frame counter 704 de-asserts its output after the first frame is received.

The control unit 702 also includes a code rate controller 706, which is configured to receive an indication of an average number of decoding iterations (e.g., the average number of decoding iterations required to decode each of a certain number of data frames, such as 10 data frames, 100 data frames, etc.) and an indication of a quality of the communication channel 102 (e.g., SNR).

As described above, in some examples, the communication channel 102 quality influences whether to use the first portion or the second portion of the extended PCM 318, 500 to decode a data frame. Decoding performance is improved by using the second, larger portion of the extended PCM 318, 500, and thus it may be advantageous to decode using the second portion of the extended PCM 318, 500 rather than the first portion, responsive to the quality of the communication channel 102 being relatively lower.

For example, if the SNR is greater than a first quality threshold, a received data frame is decoded using the first portion of the extended PCM 318, 500. To facilitate this, the code rate controller 706 is configured to assert its output responsive to the SNR being greater than the first quality threshold. However, if the SNR is less than a second quality threshold, the received data frame is decoded using the second portion of the extended PCM 318, 500. To facilitate this, the code rate controller 706 is configured to de-assert its output responsive to the SNR being less than the second quality threshold. In some examples, the first and second quality thresholds are the same value and thus the determination is a binary decision; however, in other examples the first and second quality thresholds are different values (e.g., the second quality threshold represents a lower quality of the communication channel 102 than the first quality threshold).

As described above, in other examples, the average number of decoding iterations influences whether to use the first portion or the second portion of the extended PCM 318, 500 to decode a data frame. Decoding data frames using LDPC codes may take varying numbers of iterations (e.g., to decode and/or correct errors in a data frame). Accordingly, the average number of decoding iterations required over a number of data frames is a relative indicator of communication channel 102 performance, and thus it may be advantageous to decode using the second portion of the extended PCM 318, 500, rather than the first portion, responsive to the average number of decoding iterations being relatively higher.

For example, if the average number of iterations is less than a first iterations threshold, a received data frame is decoded using the first portion of the extended PCM 318, 500. To facilitate this, the code rate controller 706 is configured to assert its output responsive to the average number of iterations being less than the first iterations threshold. However, if the average number of iterations is greater than a second iterations threshold, the received data frame is decoded using the second portion of the extended PCM 318, 500. To facilitate this, the code rate controller 706 is configured to de-assert its output responsive to the average number of iterations being greater than the second iterations threshold. In some examples, the first and second iterations thresholds are the same value and thus the determination is a binary decision; however, in other examples the first and second iterations thresholds are different values (e.g., the second iterations threshold represents a greater average number of iterations, or a lower performance of the communication channel 102 than the first iterations threshold).

The outputs of the frame controller 704 and the code rate controller 706 are provided as inputs to an OR gate 708. The particular logic implemented in FIG. 7 is exemplary, and it should be understood that other logical arrangements are possible, such as to prioritize certain considerations in deciding whether to enable or disable the extended CNU block 703 (or portions thereof). An output of the OR gate 708 is provided to the extended CNUs 703, which are disabled when the output of the OR gate 708 is asserted and are enabled when the output of the OR gate 708 is de-asserted. As explained above, disabling the extended CNUs 703 corresponds to using a first portion (e.g., a subset) of the extended PCM 318, 500 to decode a received data frame.

Accordingly, at least in the example of FIG. 7, the extended CNUs 703 may be configured to be disabled responsive to the data frame being, for example, a first data frame. The extended CNUs 703 also may be configured to be disabled responsive to the SNR for the communication channel 102 being greater than a quality threshold. The extended CNUs 703 also may be configured to be disabled responsive to the average decoding iterations for a certain number of data frames being less than an iterations threshold. However, the extended CNUs 703 are enabled after a first data frame (or a first number of data frames) is received, and the code rate controller 706 determines that a communication channel 102 quality is sufficiently low (e.g., based on the average decoding iterations, the SNR of the communication channel 102, or a combination thereof) to warrant using a larger portion of the extended PCM 318, 500 than the first portion. As described above, disabling the extended CNUs 703 that are not part of the subset of the extended PCM 318, 500 used for decoding reduces power consumption of the decoder 302 when decoding using the subset of the extended PCM 318, 500.

In other examples, the extended CNUs 703 receive a multi-bit control signal to enable and/or disable portions of the extended CNUs 703. For example, a first control signal disables all the extended CNUs 703 (e.g., to implement the base PCM portion 502 of the extended PCM 318, 500); a second control signal disables some of the extended CNUs 703 and enables others of the extended CNUs 703 (e.g., to implement the portions 506, 508 of the extended PCM 318, 500); and a third control signal enables all of the extended CNUs 703 (e.g., to implement the extended PCM 318, 500 as the second portion 504). As described above, this enables the decoder 302 to implement multiple LDPC code rates using the single extended PCM 318, 500, which reduces storage requirements relative to storing different PCMs for different code rates to be implemented.

Figure 8:
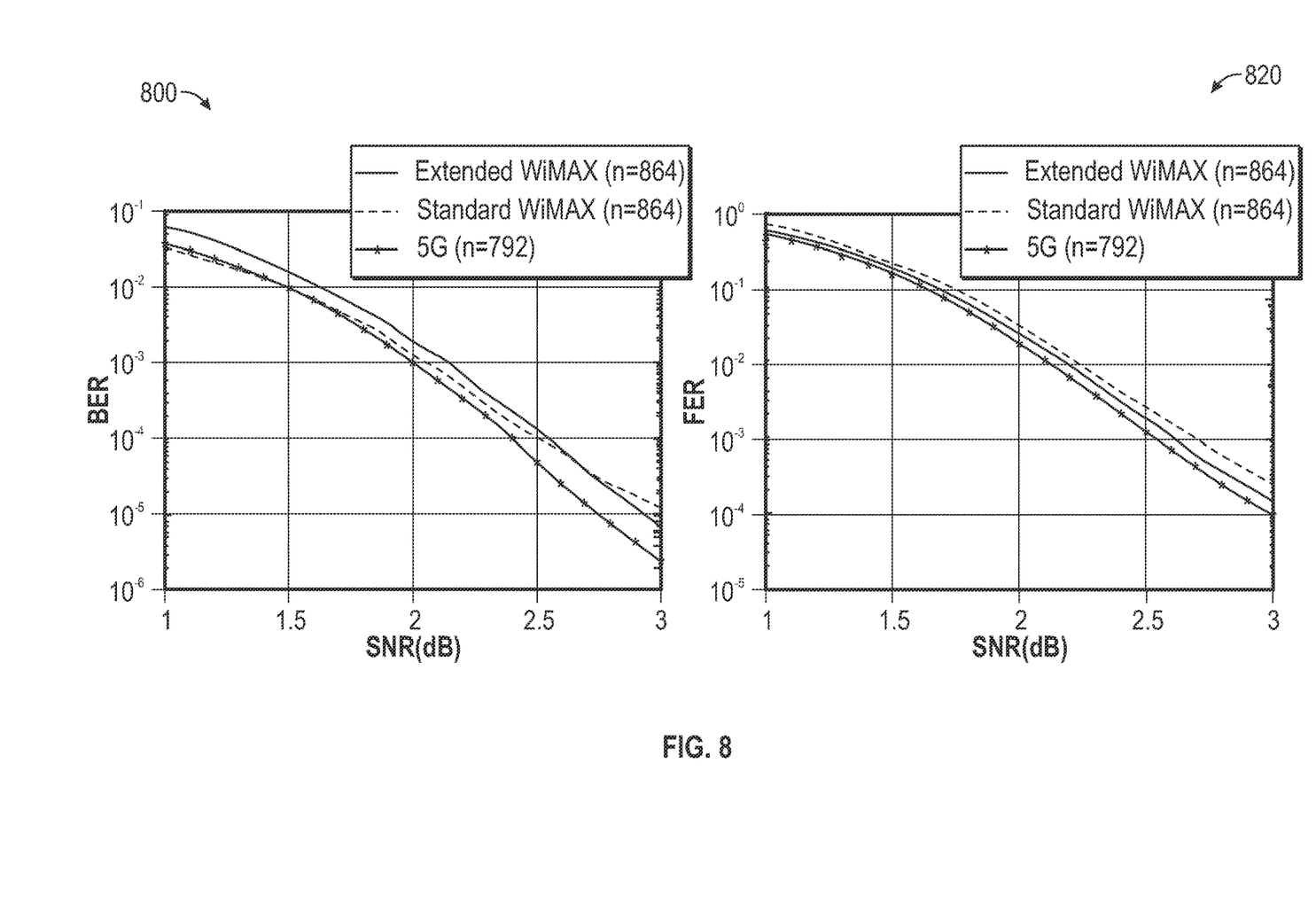
FIG. 8 is a graphical representation of bit error rate (BER) and frame error rate (FER) as a function of signal-to-noise ratio (SNR) for a communication channel in accordance with examples of this description.

FIG. 8 includes graphs 800, 820 of bit error rate (BER) and frame error rate (FER), respectively, as a function of signal-to-noise ratio (SNR) of a communication channel 102 in accordance with examples of this description. The graphs 800, 820 compare decoding performance of three 1/2 rate PCM structures. The "standard WiMAX" plot corresponds to the WiMAX 1/2 rate PCM with a codeword size of 864. The "extended WiMAX" plot corresponds to the extended PCM 318, 500 described above, with a codeword size of 864. The "5G" plot corresponds to a standard 5G 1/2 rate PCM with a codeword size of 792, which is similar in size to the codewords of the standard and extended WiMAX plots (e.g., 5G does not support a codeword of 864 bits with its 1/2 rate PCM).

In general, the 5G PCM is the best performer in terms of both FER and BER. However, decoding using the extended PCM 318, 500 described herein achieves an improved BER compared to 1/2 rate standard WiMAX when SNR values are greater than approximately 2.6 dB.

In the FER graph 820, for a FER=$10^{-3}$, decoding using the extended PCM 318, 500 described herein performs better by approximately 0.1 dB compared to standard 1/2 rate WiMAX. One reason that decoding using the extended PCM 318, 500 described herein demonstrates somewhat worse BER performance, but better FER performance in lower-SNR cases is because most uncorrected errors in the examples described herein are accumulated in the first few data frames, while errors in standard WiMAX are dispersed throughout all frames. Thus, decoding using the extended PCM 318, 500 and associated techniques described herein not only outperforms the standard 1/2 rate WiMAX with the same code length, but also performs closely to the newly-introduced 5G standard.

In certain examples, the functionality described herein (e.g., of the decoder 302, the control unit 702, or systems including those components) is implemented by the execution by a hardware processor of firmware or software (e.g., stored on a non-transitory computer-readable medium) that causes the hardware processor to provide such functionality.

Figure 9:
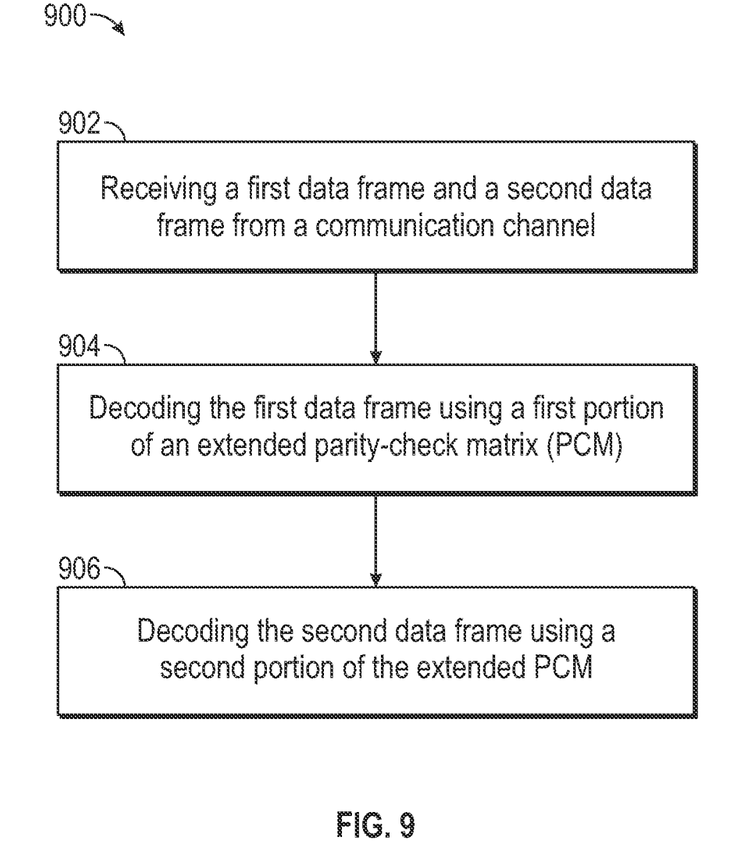
FIG. 9 is a flow chart of a method for dynamic decoding of data frames using different code rates in accordance with examples of this description.

For example, FIG. 9 a flow chart of a method 900 for dynamic decoding of data frames using different code rates in accordance with examples of this description. In an example, the method 900 is carried out by a hardware processor responsive to executing instructions of such firmware or software. The method 900 begins in block 902 with receiving a first data frame and a second data frame from a communication channel. For example, the receiver 120 of the device 106 may receive multiple data frames of a data stream from the device 104 via the communication channel 102.

The method 900 continues in block 904 with decoding the first data frame using a first portion of an extended PCM. The method 900 concludes in block 906 with decoding the second data frame using a second portion of the extended PCM. As described above, information bits (e.g., LLRs) are dynamically decoded using at least a first portion of the extended PCM 500 shown in FIG. 5, or using a second portion of the extended PCM 500. The first portion is a subset of the second portion. In at least one example, the first portion is the base PCM (sections A and B of the extended PCM 500), while the second portion is the whole extended PCM 500, shown as portion 504 in FIG. 5. However, in other examples, the portions of the extended PCM 500 used for decoding include other subsets of the extended PCM 500 such as the portion 506 or the portion 508 shown in FIG. 5. In accordance with certain examples, any subset of the extended PCM 500 that includes at least the base PCM can be used for decoding received data.

Because the portion 502 corresponds to a relatively high rate PCM e.g., 3/4 rate), and the portion 504 corresponds to a relatively lower rate PCM (e.g., 1/2 rate), the portions 506, 506 represent code rates between 3/4 and 1/2 (and thus the varying performance characteristics associated with such code rates). Accordingly, because multiple code rates are available using the single extended PCM in the method 900, the only the single extended PCM 318, 500 needs to be stored in memory in order to facilitate decoding using more than one code rate.

Additionally, decoding information bits using the first portion 502 of the extended PCM 500 in block 904 reduces latency and/or improves throughput of the communication system 100, while decoding using the second portion 504 of the extended PCM 500 in block 906 improves error correcting performance, such as by reducing the bit error rate (BER) and/or frame error rate (FER) of received data frames in a data stream.

While exemplary embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure.

Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A method, comprising:
   receiving a first data frame and a second data frame from a communication channel;
   decoding the first data frame using a first portion of an extended parity-check matrix (PCM) responsive to either a quality of the communication channel being greater than a first channel quality threshold, or an average decoding iterations value being less than a first iterations threshold; and
   decoding the second data frame using a second portion of the extended PCM responsive to either the quality of the communication channel being less than a second channel quality threshold, or the average decoding iterations value being greater than a second iterations threshold;
   wherein the first portion is a subset of the second portion.

2. The method of claim 1, wherein:
   decoding the first data frame using the first portion is responsive to the first data frame being a first frame of a data stream; and
   the second data frame is a subsequent frame of the data stream.

3. The method of claim 1, wherein:
   the first portion comprises a wireless communication mother code; and
   the second portion comprises all of the extended PCM.

4. The method of claim 3, further comprising:
   receiving a third data frame from the communication channel;
   decoding the third data frame using a third portion of the extended PCM;
   wherein the first portion is a subset of the third portion, and the third portion is a subset of the second portion.

5. A device, comprising:
   a receiver configured to receive a first data frame and a second data frame from a communication channel; and
   a decoder coupled to the receiver, the decoder comprising:
   a plurality of check nodes; and
   a control unit configured to:
      disable a subset of the check nodes to decode the first data frame using a first portion of an extended parity-check matrix (PCM) responsive to either a quality of the communication channel being greater than a first channel quality threshold, or an average decoding iterations value being less than a first iterations threshold; and
      enable the subset of the check nodes to decode the second data frame using a second portion of the extended PCM responsive to either the quality of the communication channel being less than a second channel quality threshold, or the average decoding iterations value being greater than a second iterations threshold;
   wherein the first portion is a subset of the second portion.

6. The device of claim 5, wherein the decoder comprises a control unit configured to:
   disable the subset of the check nodes responsive to the first data frame being a first frame of a data stream; and
   enable the subset of the check nodes responsive to the second data frame being a subsequent frame of the data stream.

7. The device of claim 5, wherein the decoder is a programmable device selected from a group consisting of: a field-programmable gate array (FPGA), digital signal processor (DSP), graphical processing unit (GPU), central processing unit (CPU), or an application-specific integrated circuit (ASIC).

8. The device of claim 5, wherein:
   the first portion comprises a wireless communication mother code; and
   the second portion comprises all of the extended PCM.

9. The device of claim 8, wherein:
the receiver is further configured to receive a third data frame from the communication channel;
the decoder is further configured to decode the third data frame using a third portion of the extended PCM; and
the first portion is a subset of the third portion, and the third portion is a subset of the second portion.

10. A non-transitory, computer-readable medium containing instructions that, when executed by a processor of a device, cause the device to be configured to:
receive a first data frame and a second data frame from a communication channel;
decode the first data frame using a first portion of an extended parity-check matrix (PCM) responsive to either a quality of the communication channel being greater than a first channel quality threshold, or an average decoding iterations value being less than a first iterations threshold; and
decode the second data frame using a second portion of the extended PCM responsive to either the quality of the communication channel being less than a second channel quality threshold, or the average decoding iterations value being greater than a second iterations threshold;
wherein the first portion is a subset of the second portion.

11. The non-transitory, computer-readable medium of claim 10, wherein the instructions, when executed by the processor, cause the device to be further configured to decode the first data frame using the first portion responsive to the first data frame being a first frame of a data stream, wherein the second data frame is a subsequent frame of the data stream.

12. The non-transitory, computer-readable medium of claim 10, wherein:
the first portion comprises a wireless communication mother code; and
the second portion comprises all of the extended PCM.

13. The non-transitory, computer-readable medium of claim 12, wherein the instructions, when executed by the processor, cause the device to be further configured to:
receive a third data frame from the communication channel;
decode the third data frame using a third portion of the extended PCM;
wherein the first portion is a subset of the third portion, and the third portion is a subset of the second portion.

* * * * *